United States Patent [19]
Epsom et al.
[11] Patent Number: 4,775,847
[45] Date of Patent: Oct. 4, 1988

[54] TUNABLE RESONANT CAVITY FILTER STRUCTURE WITH ENHANCED GROUND RETURN

[75] Inventors: Robert L. Epsom; Terry K. Mansfield, both of Palatine; Anthony M. Pirih, Roselle; Scott J. Propp, Algonquin; Thomas L. Spicer, Chicago, all of Ill.

[73] Assignee: Motorola, Inc., Schaumburg, Ill.

[21] Appl. No.: 939,822

[22] Filed: Dec. 9, 1986

[51] Int. Cl.[4] .......... H01P 7/04; H05K 5/02

[52] U.S. Cl. .......... 333/226; 333/224; 333/207; 174/51

[58] Field of Search .......... 339/14 R, 263 R, 255 B; 174/51; 333/226, 224, 207

[56] References Cited

U.S. PATENT DOCUMENTS

| | | | |
|---|---|---|---|
| 2,794,960 | 6/1957 | Ellis . | |
| 2,920,286 | 1/1960 | Havstad . | |
| 3,390,369 | 6/1968 | Zauertnik et al | 339/14 R |
| 3,516,030 | 6/1970 | Brumbelow | 333/226 X |
| 3,631,363 | 12/1971 | Miller . | |
| 3,639,883 | 2/1972 | Drapkin | 333/14 R |
| 3,747,044 | 7/1973 | Vazzaro | 333/14 R |
| 3,786,399 | 1/1974 | McHattie . | |
| 4,494,093 | 1/1985 | Owlett . | |
| 4,623,764 | 11/1986 | Petre et al. | 174/51 X |

*Primary Examiner*—Eugene R. LaRoche
*Assistant Examiner*—Nathan W. McCutcheon
*Attorney, Agent, or Firm*—Donald B. Southard; Anthony J. Sarli, Jr.

[57] ABSTRACT

A tunable resonant cavity filter structure is disclosed which includes an enhanced ground return internal to the cavity which effectively eliminates generation of deterioration wide band noise and optimizes unloaded Q as well as rending resonant frequency stable with vibration. In its preferred form, the enhanced ground return is in the form of a ground return clip with reliant radial projections that mate with the threads of the threadable tuning element used to determine final operating frequency. The radial projections are deflected in cantilever fashion so as to generate sufficient pressure to break thru any oxides in the tuning element threads and ensure metal-to-metal contact.

19 Claims, 2 Drawing Sheets

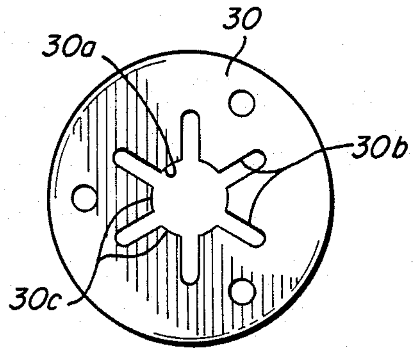
FIG. 3
FIG. 4
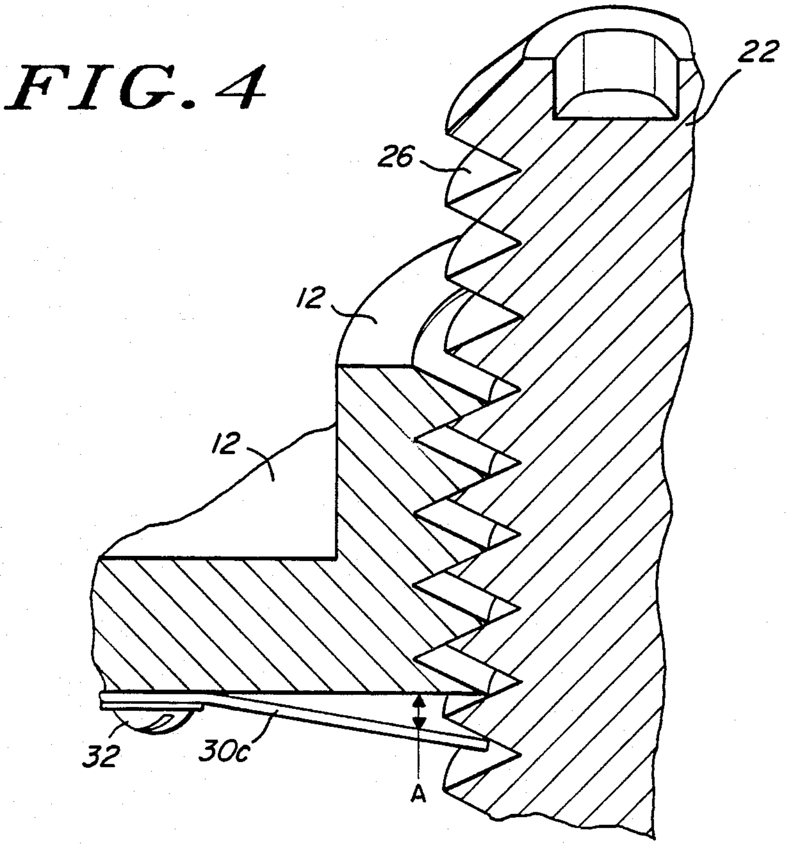

TUNABLE RESONANT CAVITY FILTER STRUCTURE WITH ENHANCED GROUND RETURN

BACKGROUND OF THE INVENTION

The present invention relates in general to resonant cavity filter structures and more particularly to such cavities that collectively form a duplexer useful in radio communication apparatus and wherein such cavity structures minimize the generation of wideband noise, eliminates coarse adjustments and reduces the sensitivity of the resonant frequency of the resultant cavity structure to vibration.

Resonant cavity structures are of course known in the art. So too are duplexer devices which incorporate one or more of such resonant cavities. Such duplexers are primarily intended for use in radio communication apparatus to selectively pass signal energy between the transmitter and an antenna and between the receiver and the same antenna. For operating frequencies in the UHF frequency band range, for example, these cavities are on the order of 20 cubic inches or so and are capable of passing substantial power or signal energy.

Conventionally, these cavity structures include a foreshortened resonator element in the interior thereof to determine the final resonant frequency the cavity will operate at. Typically the resonator is at or about one-eighth of a wave length of the involved frequency or frequency range. A tuning element typically extends through the cavity wall into close proximity of the resonator and by adjusting the position thereof, the end loading of the resonator is altered and with it the resonant frequency of the cavity. In this way, the cavity becomes tunable over a certain predictable frequency range. This tuning element must be accessible from the exterior of the cavity and therefore is made threadable to mate with corresponding machine screw threads in the wall of the cavity housing, usually in the top thereof.

Therein lies the difficulty for those cavity devices known in the art. This thread interface gives rise to a number of deleterious effects on desired performance. RF currents must passs through these threads and because of the inevitable minute imperfections therein, the metal-to-metal contact is only at a few point contacts within the thread with oxide "insulators" therebetween. At relatively high power levels, transmission line effects that occur within these threads give rise to a potential difference across the oxides. The magnitudes thereof are entirely sufficient to break down the oxides with the result that electric arcs occur which in turn gives rise to the generation of wide band noise. In the receiver portion of the associated transceiver, "desensing" occurs, and in the transmitter section power is lost. This phenomenon is known in the art as "fritting", and because the arcs tend to be mechanically unstable, the generation of noise is sustained for long periods of time, all to the detriment of the performance of the associated transceiver. Further, the lack of consistent low impedance connection in the interface threads themselves result in reduced unloaded Q for the cavity and resonant frequency sensitivity with vibration causing intermittent power out.

These problems have been addressed in the past, but those heretofore attempted solutions have proved unsatisfactory in one aspect or another. One prior approach involved a lock or jam nut on the threadable tuning element intended to rigidly hold such element in its final adjusted position. However, such does not prevent oxides from forming and the attendant problems therein. Also such jam nuts often cause distortion in the threads themselves.

Accordingly, what is needed is a substantial improvement or enhancement in the thread contacts where ground return is effected so as to eliminate or substantially reduce the generation of wideband noise due to fritting and to accommodate any minute thread imperfections that may otherwise occur. This, in turn, would optimize unloaded Q and make the resonant frequency of the cavity stable with vibration.

SUMMARY OF THE INVENTION

It is an object of the present invention to provide an improved cavity filter structure which overcomes the foregoing deficiencies.

A more particular object of the present invention is to provide a bandpass tunable cavity filter structure wherein an enhanced ground return is effected for RF currents occurring across its thread interface to substantially eliminate fritting and the attendant generation of wideband noise.

In accordance with these and other objects, in one embodiment of the present invention, improved cavity filter structure is provided which includes a housing forming the cavity, with a foreshortened resonator element positioned in the interior thereof and a tunable element threadably extending into such cavity in close proximity to such resonator element. This tuning element end loads the resonator and tunes the cavity to its desired frequency. Also included is an enhanced ground return for RF currents occurring across the thread interface between the tuning element and the interior of the cavity. This substantially eliminates fritting, giving rise to the generation of wideband noise, optimizes unloaded Q and renders resonant frequency stable with vibration. In one embodient for the enhanced ground return, a return ground clip is provided between the threads of the tuning element and the interior face wall of the cavity itself.

BRIEF DESCRIPTION OF THE DRAWINGS

The features of the invention which are believed to be novel are set forth with particularity in the appended claims. The invention itself, however, both as to its organization and method of operation, together with further objects and advantage thereof, may be best understood by reference to the following description when taken in conjunction with the accompanying drawings, in which:

FIG. 3 is a plan view of a ground return clip which provides the advantages and benefits of the present invention; and FIG. 4 is an enlarged fragmentary cross section of the threads of the tuning element and the cavity housing in cooperation with the ground return clip of FIG. 3.

BRIEF DESCRIPTION OF THE PREFERRED EMBODIMENT

Figure 1:
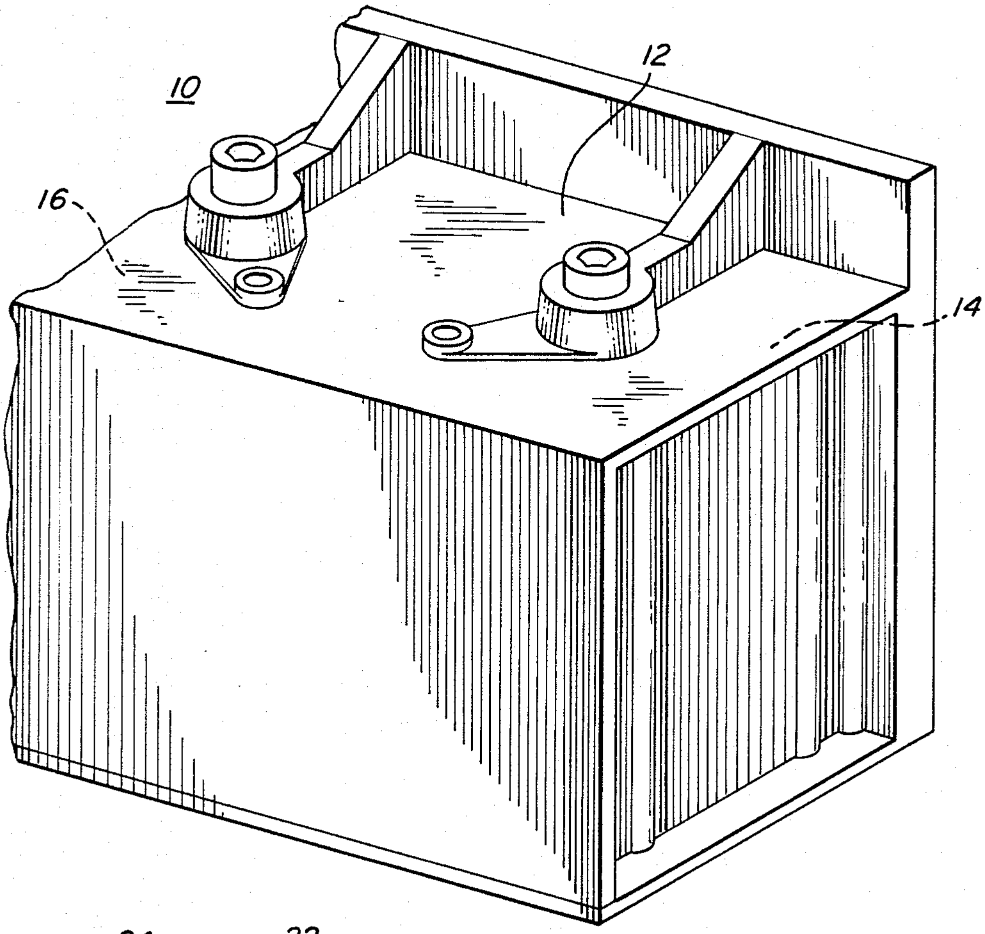
FIG. 1 is a perspective view in elevation of a cavity filter structure which has been constructed in accordance with the present invention.

Referring now to the drawings, a duplexer cavity filter structure 10 is shown which has been constructed in accordance with the present invention. The duplexer 10 includes a housing 12 forming a pair of resonant cavity filters 14 and 16. The former not specifically shown and the latter best seen in FIG. 2. Each of the cavities are essentially identical so that only one such cavity need be considered in detail. There could, of course, be more cavities employed than just the two herein illustrated. The two-cavity duplexer unit is entirely sufficient to illustrate the underlying principles of the present invention.

The characteristics and operation of the duplexer 10 itself is generally known and understood in the art such that detailed description thereof should not be necessary. Suffice it to say that one cavity thereof may serve as a post filter for the transmitter section of an associated transceiver, mobile or fixed (not shown), and the other cavity may serve as a preselector for the receiver section. Together, with optimal transmission lines (not shown) they form the duplexer working into a common antenna. Each cavity includes a pair of ports, one such port in each cavity being connected to a common antenna and the other port of each cavity being connected to either the transmitter or the receiver. Accordingly, signal energy to be transmitted from the antenna is selectively routed from the transmitter to the antenna and signals received by the antenna are selectively routed to the receiver.

Figure 2:
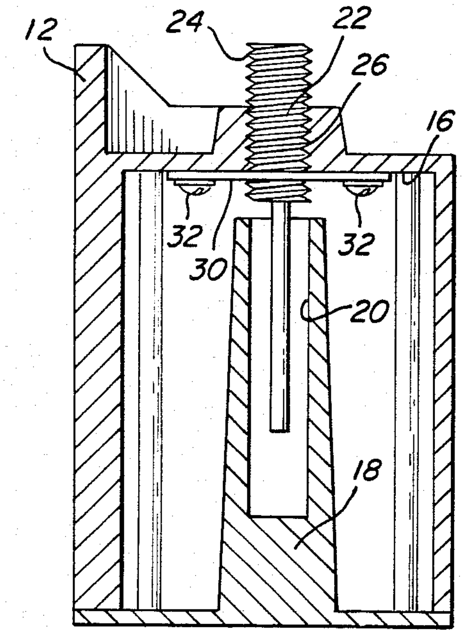
FIG. 2 is a cross-section of one of the cavities in the structure of FIG. 1 showing internal detail.

FIG. 2 illustrates a cross sectional view of cavity 16. The cavity itself is formed by respective walls of the housing 12. Within cavity 16 is a foreshortened resonator element 18. In its preferred form, resonator 18 is a coaxial resonator with the hollow end portion 20. Resonator 18 is typically one-eighth or so wavelength of the frequency or frequencies involved. A tuning element 22 extends through the housing wall, i.e., the top thereof, in the interior of the cavity 16 with a portion thereof exending into the opening 20 of the resonator 18. Tuning element 22 end loads resonator 18 to adjust its effective electrical length and thereby determines the desired resonant frequency of the cavity structure as a whole.

To make the tuning element 22 accessible from outside the cavity structure, it is made threadable such as shown at 24 which then is made to mate with corresponding threads 26 in the top of housing 12. It is this thread interface 24-26 between cavity housing 12 and tuning element 22 that gives rise to the fritting effect and the attendant problems with respect thereto as previously enumerated. To correct this problem, an enhanced ground return is provided, which in a preferred form is the ground return clip 30, best seen in FIG. 3.

This ground return clip 30 is positioned at the entry point of the tuning element 22 into the cavity 16. It is mounted in position by suitable means, such as machine screws 32. Ground return clip 30 includes a central aperture or opening **30*a* with radial slots 30*b* spaced equally thereabout forming radial projection members 30*c*. Opening 30*a* is dimensioned to frictionally accommodate the threads 26 of tuning element 22. This may be somewhat better appreciated by reference to FIG. 4. As therein shown, the threads 26 of tuning element 22 thread through ground return clip opening 30*a* but create torsional and cantilever deflection action on the radial projection members 30*c* of clip 30. In deflecting these radial projections and making them twist and deflect along the flanks of tuning element 22, a substantial force is caused by the lead angle of the threads 26**, say on the order of 10 to 20 pounds. This causes sufficient pressure to ensure that any oxides will be broken through and good metal-to-metal contact made. A low impedance contact is obtained in all instances. As previously pointed out, the good metal-to-metal contact eliminates fritting and the attendant undesirable generation of wide band noise and the low impedance contact guarantees higher unloaded Q than would otherwise obtain.

It should be also noted that ground return clip 30 is affixed to the top of cavity 16 in the manner shown in FIG. 2. It is thin enough to effect no substantial change in the end loading of resonator 18. In one form found entirely satisfactory in terms of performance characteristics, clip 30 was constructed of beryllium copper and plated with silver to provide a metallurgically compatible interface with tuning element 22, which was likewise silver plated, as well as the surface wall of cavity 16, which was tin plated.

As thusly constructed, ground clip 30 provides a simple, flat, close tolerance, thermally stable mechanical contact of sufficiently low impedance which serves as an enhanced ground return. It should be noted that, as such, it would provide advantageous use for any application where substantial RF currents must flow across a threaded interface.

What is claimed is:

1. An improved band pass, tunable resonant cavity filter structure wherein the generation of wide band noise is minimized, comprising in combination:

a housing forming a cavity;

a foreshortened resonator element positioned within said cavity for determining the frequency at which said cavity resonates;

a threadably tuning element extending through said housing to a position in said cavity so as to end load said resonator and tune said cavity to a desired frequency; and means internal of said cavity for providing an enhanced ground return between said threadable tuning element and the interior of said cavity housing, thereby substantially eliminating the generation of undesirable wide band noise.

2. An improved band pass, tunable resonant cavity filter structure in accordance with claim 1, wherein said enhanced ground return means is provided in the form of a ground return clip fixed to the interior of said cavity and threadably receiving said tuning element.

3. An improved band pass, tunable resonant cavity filter structure in accordance with claim 2, wherein said ground return clip includes resilient radial projection members deflected in cantilever fashion to effect a substantial pressure point between end portions thereof and the threads of said tuning element sufficient to break down any oxides on said threads and make metal-to-metal contact therebetween.

4. An improved band pass, tunable resonant cavity filter structure in accordance with claim 2, wherein said ground return clip has no substantial end loading effect on said resonator element.

5. An improved band pass, tunable resonant cavity filter structure in accordance with claim 2, wherein said ground return clip is constructed of beryllium copper.

6. An improved band pass, tunable resonant cavity filter structure in accordance with claim 2, wherein said ground return clip and said tuning element are plated with compatible metal materials.

7. An improved band pass, tunable resonant cavity filter structure in accordance with claim 6, wherein the metal plating on said ground return clip and said tuning element is silver.

8. An improved band pass, tunable radio duplexer structure having tunable resonant cavity filters wherein the generation of wide band noise is eliminated, comprising in combination;

a housing forming a pair of cavities, each of which includes;

a foreshortened resonator element positioned within said cavity for determining the frequency at which said cavity resonates, a threadable tuning element extending through said housing to a position in said cavity so as to end load said resonator and tune said cavity to a desired frequency, and means internal of said cavity for providing an enhanced ground return between said threadable tuning element and the interior of said cavity housing, thereby substantially eliminating the generation of undesirable wide band noise.

9. A method of effecting a low noise, band pass, tunable, resonant cavity filter structure, comprising the steps of:

providing a housing which forms at least one cavity;

positioning a frequency determining resonator element within said cavity;

threading a tuning element into said cavity through said housing to a position which selectively end loads said resonator elements; and providing an enhanced ground return between said threaded tuning element and said cavity, said ground return being in the form of a ground return clip mounted to the top interior wall of said cavity and threadably receiving said tuning element.

10. A method of effecting a low noise, band pass, tunable resonant cavity filter structure, in accordance with claim 9 which includes the further step of providing said ground return clip with resilient radial projection members which deflect in cantilever fashion to provide a pressure contact sufficient to break down any oxides formed on the threads of said tuning element.

11. A method of effecting a low noise, band pass, tunable resonant cavity filter structure, in accordance with claim 10, which includes the further step of constructing said ground return clip of beryllium copper.

12. A method of effecting a low noise, band pass, tunable resonant cavity filter structure, in accordance with claim 10, which includes the further step of plating said ground return clip and said tuning element with compatible metals.

13. A method of effecting a low noise, band pass, tunable resonant cavity filter structure, in accordance with claim 12, which includes the step of plating said ground return clip and said tuning element with silver.

14. In an improved low noise, band pass, tunable resonant cavity filter structure having a foreshortened frequency determinating resonator element positioned therein and a threadable tuning element extending into said cavity to a position to selectably end load the resonator element and tune the cavity to a desired frequency, the improvement comprising:

means for providing an enhanced ground return between said threadable tuning element and interior of said cavity, said means being in the form of a ground return clip fastened to the top interior wall of the cavity and threadably receiving said tuning element.

15. An improved low noise, band pass, tunable resonant cavity filter structure in accordance with claim 14 wherein said ground return clip includes resilient radial projection members deflected in cantilever fashion to provide a sufficient pressure contact to break through any oxides formed on the threads of said tuning element.

16. An improved low noise, band pass, tunable resonant cavity filter structure in accordance with claim 14 wherein said ground return clip has no substantial end loading effect on said resonator element.

17. An improved low noise, band pass, tunable resonant cavity filter structure in accordance with claim 14 wherein said ground return clip is constructed of beryllium copper.

18. An improved low noise, band pass, tunable resonant cavity filter structure in accordance with claim 14 wherein said ground return clip and said tuning element are plated with compatible metals.

19. An improved low noise, band pass, tunable resonant cavity filter structure in accordance with claim 18 wherein said ground return clip and said tuning element are plated with silver.

* * * * *